(12) United States Patent  
Furuyama

(10) Patent No.: US 6,516,104 B1  
(45) Date of Patent: Feb. 4, 2003

(54) OPTICAL WIRING DEVICE

(75) Inventor: Hideto Furuyama, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 179 days.

(21) Appl. No.: 09/603,896

(22) Filed: Jun. 26, 2000

(30) Foreign Application Priority Data

| Jun. 25, 1999 | (JP) | 11-179216 |
| Jun. 29, 1999 | (JP) | 11-182741 |
| Jun. 30, 1999 | (JP) | 11-184645 |

(51) Int. Cl.[7] ............................................. G02B 6/12
(52) U.S. Cl. .............................. 385/14; 385/49; 385/91
(58) Field of Search .............................. 385/14, 92, 89, 385/93, 94, 49, 35, 38, 34, 51, 52, 88, 90, 91

(56) References Cited

U.S. PATENT DOCUMENTS

| 4,307,935 A | * 12/1981 | Monnier ....................... 385/88 |
| 4,505,539 A | * 3/1985 | Auracher et al. .......... 200/81 R |
| 4,875,750 A | * 10/1989 | Spaeth et al. ................. 385/35 |
| 6,215,925 B1 | * 4/2001 | Kaneyama .................... 385/31 |
| 6,330,377 B1 | * 12/2001 | Kosemura .................... 385/14 |

OTHER PUBLICATIONS

1998 Electronic Components and Technology Conference, IEEE; L.S. Huang et al; "MEMS Packaging for Micro Mirror Switches" pp. 592–597.

* cited by examiner

Primary Examiner—Cassandra Spyrou  
Assistant Examiner—Arnel C. Lavarias  
(74) Attorney, Agent, or Firm—Oblon, Spivak, McClelland, Maier & Neustadt, P.C.

(57) ABSTRACT

An optical wiring device providing characteristics of optical connection leads while having substantially the same mountability as that of electrical wiring devices. According to the present invention, an optical axis of a photoelectric conversion element is made consistent with an optical axis of an optical terminal having a spherical shape through a tapered hole provided in a package substrate. An optical wiring substrate includes a concave portion attached to the package substrate with the optical terminal at the position of the concave portion. The optical terminal serves as a fitting part between the package substrate and the optical wiring substrate. By putting the focal point of the optical terminal within the optical wiring substrate, an optical wiring is not exposed to the external atmosphere.

26 Claims, 11 Drawing Sheets

OPTICAL WIRING DEVICE

BACKGROUND OF THE INVENTION

1. Field of the Invention

The present invention relates to optical wiring devices for use in mounting thereon integrated high speed circuitry.

2. Discussion of the Background

Large Scale Integrated circuits (LSIs) are currently capable of operating at remarkably increased speeds due to the increased performance of bipolar transistors and field effect transistors, for example.

However, while the speed of internal operations of LSIs have increased, operation speeds at the level of printed circuit boards including mounted LSI chips and/or racks including printed circuit boards remain less than the LSI operation speeds. When operation frequencies of the printed circuit boards and racks are increased, signal transfer losses of electrical leads, noises and electromagnetic interference are also increased. Thus, it is necessary to lower the operation frequency with an increase in length of the leads used therein to prevent degradation of signals transmitted. Accordingly, currently available electrical wiring devices are incapable of improving the operation speeds, even when the operation speeds of the active LSIs elements are increased, due to the problems at the printed circuit boards and/or racks.

Several approaches have been proposed to avoid the above-noted problems. One approach uses an optical wiring device for optically connecting LSIs. With such an optical wiring/connection, frequency dependency characteristics (such as loss) hardly occur in certain frequency regions ranging from direct current (DC) up to several tens of giga-hertz (GHz). Thus, the lead wiring may offer transfer rates of several tens of gigabits per second (Gbps) because of the absence of any electromagnetic interference and/or ground potential variation noises occurring along signal transmission paths.

To achieve this optical wiring device, leads using optical guide paths or waveguides are required. Generally, connection of optical waveguides is performed through flat plate-like optical waveguide substrates or optical fibers, which can result in a decrease in general-purpose properties or flexibilities compared to electrical lead wiring methodology. Due to this, optical wiring devices are used less in general-purpose applicability than in electrical wiring devices, and are generally only used in special-purpose equipment.

SUMMARY OF THE INVENTION

Accordingly one object of the present invention is to provide a novel optical wiring device capable of optically connecting LSI chips, while retaining general-purpose features.

To attain the above object, the present invention provides an optical wiring device including a substrate having a first surface and a second surface on an opposite side of the first surface, and having a hole through the substrate between the first and second surfaces, an integrated circuit disposed on the first surface of the substrate, and an electrical wiring provided on the first surface of the substrate and connected to the integrated circuit. Also included is a photoelectric conversion element provided on the first surface of the substrate and configured to convert between electrical signals and optical signals, and an optical terminal disposed in contact with the hole on a side of the second surface of the substrate. The electrical signals are transmitted between the photoelectric conversion element and the integrated circuit, and the optical signals are transmitted to and from the photoelectric conversion element or through the optical terminal.

In addition, the through-hole in the substrate has a slant side surface for use in performing position alignment of the optical terminal.

It is preferable the optical wiring device has structures as described below.

(1) The optical terminal has a curved plane opposing the photoelectric conversion element.

(2) The hole is provided in a tapered form, and the curved plane of the optical terminal contacts a side surface of the substrate surrounding the hole.

(3) The curved plane of the optical terminal is a part of a spherical surface.

(4) The hole is provided in a tapered form, and the spherical surface of the optical terminal is in contact with a side surface of the substrate surrounding the hole.

The present invention also provides an optical wiring device including a first substrate having a first surface and a second surface on an opposite side of the first surface of the substrate, and having a hole provided through the first substrate between the first and the second surfaces, an integrated circuit disposed on the first surface of the first substrate and a photoelectric conversion element provided on the first surface of the first substrate for conversion between electrical signals and optical signals. Also included is an optical terminal disposed in contact with the hole on the side of the second surface of the first substrate and a second substrate having an optical wiring, and being attached to the first substrate with the optical terminal therebetween. The electrical signals are transmitted between the photoelectric conversion element and the integrated circuit, and said optical signals are transmitted between the photoelectric conversion element and the optical wiring through the optical terminal.

It is preferable the optical wiring device has structures as described below.

(1) The optical wiring runs within the second substrate.

(2) The optical terminal has a curved plane opposing the optical wiring, and an optical focusing point due to the optical terminal being positioned at a portion of the optical wiring.

(3) The second substrate has a concave portion, and the optical terminal has a curved plane in contact with the concave portion of the second substrate so as to be optically coupled to the optical wiring.

(4) The concave portion is provided in a tapered form, and the curved plane of the optical terminal is a part of a spherical surface in contact with a side surface of the concave portion.

(5) The optical focusing point due to the optical terminal is positioned at a portion of the optical wiring deeper than a bottom surface of the concave portion.

(6) An electrical wiring is provided on the first surface of the first substrate and is connected to the integrated circuit.

(7) The optical terminal has a curved plane opposing the photoelectric conversion element.

(8) The hole is provided in a tapered form, and the curved plane of the optical terminal contacts with a side surface of the first substrate surrounding the hole.

(9) The optical terminal has a spherical shape.

(10) The optical terminal has a curved plane opposing the photoelectric conversion element.

(11) The hole is provided in a tapered form, and the curved plane of the optical terminal contacts with a side surface of the first substrate surrounding the hole.

(12) The concave portion is provided in a tapered form, and the optical terminal has a spherical shape.

(13) There is provided an optical connector for optically connecting the optical wiring to another optical wiring, in which the optical connector allows optical signals to be transmitted therein upon application of a pressure thereto.

(14) The optical connector includes a matrix portion and holes dispersed in the matrix portion, and the longest diameter of each of the holes extends in a direction perpendicular to a direction in which the optical signals are transmitted.

(15) The optical connector includes a matrix portion and particles dispersed in the matrix portion, and the refractive index of the particles is higher than the refractive index of the matrix portion.

A principal concept of the invention lies in providing within an integrated circuit (LSI) package structure a package substrate mounting thereon one or more LSI and optical semiconductor element(s) with at least one through-hole provided in the package substrate for alignment in optical axes between an optical semiconductor element and optical input/output terminal having its distal end as formed in either a hemispherical shape or spherical tapered shape.

Another important concept of the invention lies in that a concave portion is provided at an optical input/output section of the optical wiring substrate for mechanical fixation of the optical input/output terminal, while achieving positional alignment between the package substrate and the optical wiring substrate to thereby cause the focal point of a lens of the optical input/output terminal to be put at an optical guide path or "waveguide" which lies inside of the optical wiring substrate.

Yet another feature of the invention is that the power supply and low-speed signal terminals of the integrated circuit are electrically connected via electrical connection pins while permitting high-speed signals to be via one or several photoelectric conversion elements and optical terminals and optical waveguides. Providing electrical power to those electronic components within the integrated circuit in this way, while achieving high-speed signals by use of optical signals, makes it possible to prevent degradation of signals at the board level.

In accordance with the present invention, it is possible to achieve a process separation, which is similar to that of standard LSI mounting schemes such as LSI packages and wiring substrate mounting procedures, because the procedure for an optical axis adjustment between photoelectric conversion elements and optical waveguides is split into an adjustment between the photoelectric conversion elements and optical input/output terminals and an adjustment between optical input/output terminals and optical waveguides.

Thus, it is possible to manufacture the LSI package and the wiring substrate independent of each other while facilitating an increase in size of an optical wiring substrate because the optical lead wiring substrate manufacturing procedure avoids the necessity of mounting photoelectric conversion elements. In addition, the LSI package is such that the use of a specific package substrate with optical terminals provided in advance makes it possible for the LSI package substrate to be put into the standard LSI packaging process flow with a minimal number of extra process steps.

Furthermore, at the stage of mounting the optical wiring substrate, it is possible to achieve mechanical joint or engagement of optical terminals with an accuracy of position alignment equivalent to that of electrical terminals, which enables simultaneous mountabilities with the remaining electronic parts or components, because an individual optical axis alignment is no longer required. Additionally, the position of the focal point of an optical terminal is placed inside of the optical wiring substrate, making it possible to resolve the problem of surface contamination of the optical wiring substrate, thus facilitating a handling thereof.

As discussed above, in accordance with the optical wiring package and optical wiring device incorporating the principles of the present invention, the process steps inherently required for optical wiring/interconnection schemes are simplified or minimized while using the currently established standard electronic parts-mounting techniques. Thus, it is possible to attain the intended optical wiring mounting procedure without having to significantly increase mounting costs so the present invention advantageously offers an ability to construct a system capable of performing an operation at high speeds at the level of boards and racks while reducing production costs.

The present invention also provides an optical wiring device including a first substrate, an integrated circuit disposed on the first substrate, and a photoelectric conversion element provided on the first substrate for conversion between electrical signals and optical signals. Also included is an optical terminal opposing the photoelectric conversion element and a second substrate having a first optical wiring, and being attached to the first substrate with the optical terminal therebetween. The first optical wiring includes a first clad layer and a first optical waveguide surrounded by the first clad layer. Also included is a second optical wiring including a second clad layer and a second optical waveguide surrounded by the second clad layer. In addition, a part of the first optical waveguide is not covered by the first clad layer so as to be exposed therefrom, and the second optical wiring is attached to the first optical waveguide in a direction extending along the first optical waveguide at the part of the first optical waveguide to be exposed. Further, the electrical signals are transmitted between said photoelectric conversion element and said integrated circuit, and said optical signals are transmitted between the photoelectric conversion element and the first and second optical wiring through the optical terminal.

It is preferable that the optical wiring device has structures as described below.

(1) An end portion of the second optical wiring is thinner than other portions thereof at the exposed part of the first optical waveguide.

(2) The first optical waveguide has an end portion in tapered form at the exposed part thereof.

(3) The second optical waveguide has an end portion in tapered form at the exposed part of the first optical waveguide.

The optical connector as described above may be employed in the optical wiring device according to the present invention.

Additionally, the invention provides a method of manufacturing an optical wiring device including an optical wiring substrate having a clad layer formed on or over a substrate, an optical waveguide formed in this clad layer, and an optical contact portion as formed through exposure of the optical waveguide resulting from removal of part of the clad layer. The method includes the steps of disposing, when connecting an optical wire to the optical contact portion of the optical wiring substrate, the optical wire including a resin-based optical waveguide body at the optical contact portion in a direction along the optical waveguide, and then performing connection to the optical contact portion while substantially simultaneously pushing a collect from specified part overlying the optical wire to thereby force a distal end of the optical wire to be deformed into a taper-like shape by ultrasonic wave welding or thermal compression bonding techniques.

In addition, the invention provides an apparatus used for manufacturing an optical wiring device. The apparatus includes a container housing for receiving therein a continuous optical wire, a mechanism for controlling outward delivery or feeding of the optical wire, and a collect for use in rigidly securing the optical wire to an optical contact portion of an optical waveguide while applying thereto a pressure and ultrasonic wave. The collet has at its front and rear portions slant surfaces for permitting segmentation of the optical wire, and the apparatus has functions of letting the optical wire be deformed into a taper-like shape through application of ultrasonic wave and/or heat during bonding, and causing, during cutting of the optical wire, the feed control mechanism to give a tensile force to the optical wire in a pressure application state of the collet to thereby cut the optical wire at a specific portion corresponding to the rear part of the collet.

The present invention is aimed at stabilizing optical waveguide characteristics by making use of a buried type optical guide path for the optical wiring waveguide thereof.

Furthermore, the resultant parts mount density may be increased because connection of the optical wire is in a specific direction along a substrate surface of the optical waveguide without providing the optical waveguide with any orthogonal conversion sections.

Further, with the present invention, any intended optical coupling with the optical wire may be made easier, resulting in prevention of optical losses because the clad layer overlying the optical waveguide is partly removed away at the contact portion.

Furthermore, the present invention further facilitates the optical coupling to thereby reduce optical losses, by forming the optical wire connection section of the optical waveguide into a tapered shape or alternatively forming the optical waveguide connection section of the optical wire into a taper-like shape.

According to present invention, the optical wire is manufactured in advance separately for the improvement in uniformity and reproducibility of optical wire characteristics. Additionally, the present invention makes manufacturing processes easier by employing a resin-made optical waveguide body as the optical wire and also by performing rigid adhesion to the optical waveguide while the optical wire distal end is deformed into a taper shape through ultrasonic wave welding and/or thermo-compression bonding processes.

The present invention also further facilitates connection between the optical waveguide and the optical wire, by using the collet with slant surfaces at its front and rear portions to apply ultrasonic wave or heat or both of them to thereby make the optical wire deform into a taper shape, and by cutting of the optical wire, causing the feed control mechanism to give a tensile force to the optical wire in the pressure application state of the collet.

In addition, the present invention provides an optical coupler device including an optical waveguide body and a pressure sensitive optical filter permitting penetration of rays of light upon application of a pressure thereto. The optical waveguide body is disposed while being pushed against the pressure sensitive optical filter to thereby cause the optical waveguide body and the pressure sensitive optical filter to be optically coupled together.

The present invention also provides an optical coupler device including a first optical waveguide body, a second optical waveguide body, and a pressure sensitive optical filter permitting penetration of light rays upon application of a pressure thereto. The first optical waveguide body and the second optical waveguide body are disposed so they are pushed against the pressure sensitive optical filter whereby the first optical waveguide body and the pressure sensitive optical filter plus the second optical waveguide body are optically coupled together.

The present invention also provides an optical coupler device including an optical waveguide body and a pressure sensitive optical filter permitting penetration of light rays upon application of a pressure thereto and which includes an optical semiconductor element as disposed via the optical waveguide body and the pressure sensitive optical filter. The optical waveguide body is disposed so the body is pushed against the pressure sensitive optical filter to thereby permit the optical waveguide body and the pressure sensitive optical filter to be optically coupled together, and that rays of light emitted and irradiated from the optical semiconductor element are optically guided to travel inside of the optical waveguide body.

The present invention also provides an optical coupler device including an optical waveguide body and a pressure sensitive optical filter permitting penetration of light rays upon application of a pressure thereto and which also includes an optical semiconductor element as disposed via the optical waveguide body and the pressure sensitive optical filter. The optical waveguide body is disposed so the body is pushed against the pressure sensitive optical filter to thereby cause the optical waveguide body and the pressure sensitive optical filter to be optically coupled together, and that light irradiated from the optical waveguide body is received by the optical semiconductor element.

Additionally, the present invention provides an optical coupler device with its pressure sensitive optical filter having an opening or void within an elastic body. Application of a pressure causes the void to shrink in dimension to thereby permit light to pass through it.

In addition, the present invention provides an optical coupler device in which the pressure sensitive optical filter has within the elastic body a plurality of ultrafine or "micro" high-refractivity particles higher in refractive index than the elastic body. A pressure application results in shrinkage of a distance between the micro high-refractivity particles, which in turn permits penetration of light therethrough.

The present invention is such that the optical coupler device is internally provided with the pressure sensitive optical filter for permitting penetration of light when pressed, thereby causing the intended optical coupling to be established only when the ferrule or else of an optical connector is pushed while in the other events blocking rays of light, thus essentially preventing unwanted leakage and mixture of optical signals.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
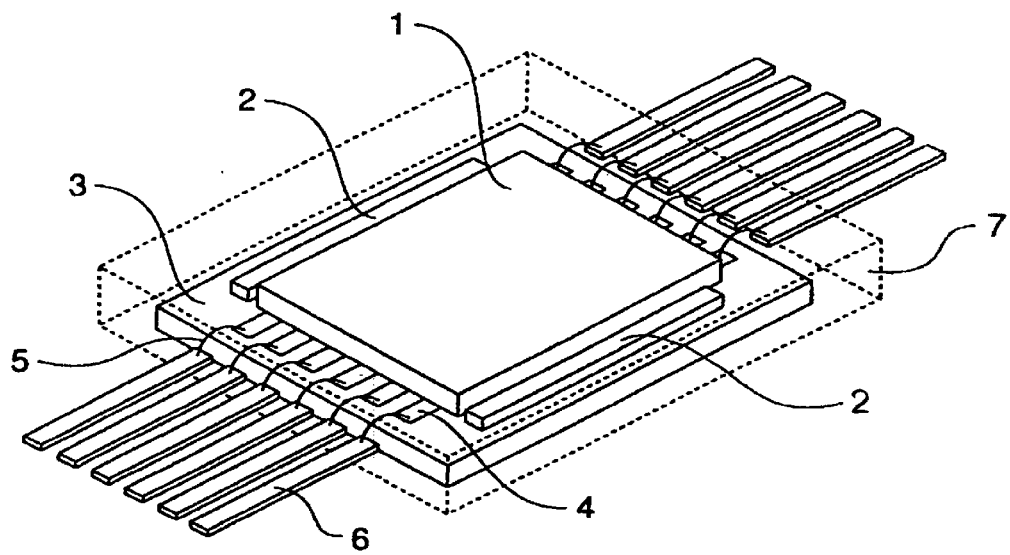
FIG. 1 is a perspective view of an optical wiring/interconnection package structure according to a preferred embodiment of the present invention.

Referring now to the drawings, wherein like reference numerals designate identical or corresponding parts throughout the several views, FIG. 1 is a perspective view of an optical wiring/interconnection package structure according to a preferred embodiment of the present invention. As shown, an LSI chip 1 is mounted on or over a package substrate 3 by flip-chip mount techniques. A couple of arrays of photoelectric conversion elements 2 are formed in adjacent to opposite sides of the LSI chip 1, and are for electrically receiving and sending signals to and from the LSI chip 1. A top surface of the package substrate 3 includes internal electrical connection leads 4 formed so they are connected by bonding wires 5 to electrical connect terminals 6 operatively associated therewith. The electrical leads 4 are connected to a power supply (not shown) of the LSI chip 1 and are coupled to low transmission speed or "low speed" signals. The LSI chip 1 and photoelectric conversion element arrays 2, internal leads 4, package substrate 3, bonding wires 5 and part of the electrical terminals 6 are molded with a molding resin material 7 into the form of a package. The photoelectric conversion element arrays 2 and optical connect terminals are optically coupled together via through-holes formed in the package substrate 3. A detailed configuration will be set forth in detail later in the description.

In the optical wiring/interconnection device thus arranged, the power supply leads of the LSI chip 1 and the low speed signals (such as operation mode control signals or the like) are coupled to the electrical terminals 6 through internal leads 4 and bonding wires 5. On the other hand, high speed signals to be transferred at high rates (such as clock signals and data, etc.), are coupled to the photoelectric conversion element arrays 2 via similar internal leads or bonding wires, and are connected as optical signals to external circuitry provided outside of the package substrate 3.

One exemplary method of manufacturing the package substrate 3 is as follows. First, the LSI chip 1 and photoelectric conversion element arrays 2 are mounted on the package substrate 3 with optical terminals and internal leads formed thereon. If the LSI chip 1 and photoelectric conversion element arrays 2 are flip-chip mounted, then electrical interconnection is achieved between the LSI chip 1 and the internal leads 4, and between the LSI chip 1 and the photoelectric conversion element arrays 2 at the same time. Alternatively, the bonding wires 5 may be separately used for the connections described above. It is also permissible the steps of forming optical terminals and mounting the LSI chip 1 and photoelectric conversion element arrays 2 are reversed.

Next, a wire connection to the electrical terminals 6 (formation of the bonding wires 5) is performed, and the entire structure is molded with a resin material 7 such as an epoxy resin or the like. Thereafter, the electrical terminals 6 are cut and reshaped to complete the intended package. At this time, a metal mold tool has been machined so distal ends of the optical terminals are exposed to an outside of the molding resin material in a way as will be described later.

Figure 2:
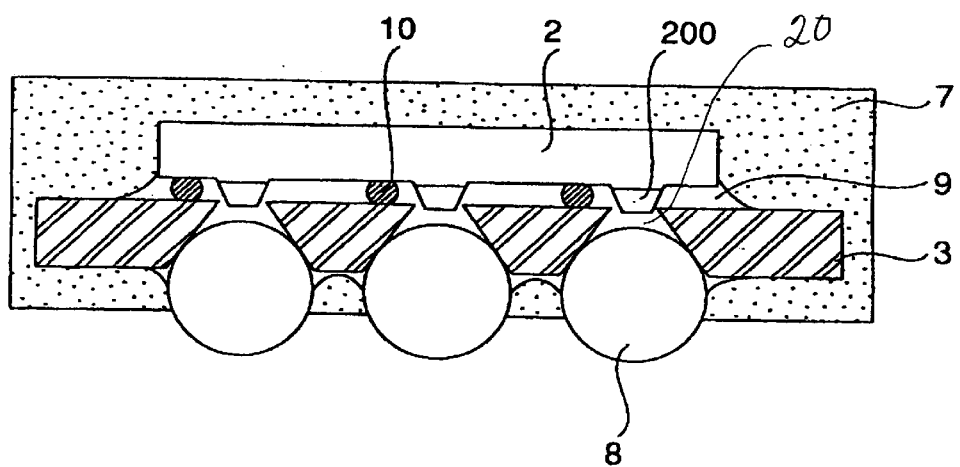
FIG. 2 is a cross-sectional view of an optical terminal section of the optical wiring package shown in FIG. 1.

FIG. 2 is a cross-sectional view of the optical wiring device shown in FIG. 1. As shown, a photoelectric conversion element active portion 200 of the photoelectric conversion element array 2 is disposed opposing to through-holes 20 having slanted side surfaces while forming a cap section thereof by a flip-chip mounting solder ball.

At a rear part of each through-hole 20, a spherical lens 8 (optical terminal) is formed so the lens 8 is stably received on the slant side surfaces of the through-hole 20. A transparent resin material 9 is filled within the through-holes 20 and in gap spaces defined between the photoelectric conversion element array 2 and package substrate 3. Numeral 7 designates the mold resin.

Solder balls 10 and leads for use in mounting the photoelectric conversion element array 2 are formed on a surface of the package substrate. The solder balls 10 are formed by mounting the photoelectric conversion element array 2 and then solder melting or fusion through thermal processing. The photoelectric conversion element array 2 moves to a predetermined location due to the presence of an interfacial force of the solder balls 10. Thus, the initial mounting of the photoelectric conversion element array 2 may be done with a relatively low accuracy of plus/minus (±) 10 microns (μm), for example, and the intended accuracy of 1 μm or less will be finally achieved by a so-called flip-chip bonding process relying upon the solder's tensile force.

The package substrate 3 may alternatively be formed, for example, from a silicon (Si) substrate having through-holes accurately formed by anisotropic etching techniques. By letting the spherical lenses 8 be fixed to the holes in association with the above-noted flip-chip bonding, it is possible to align the optical axes of the photoelectric conversion element array 2 and spherical lenses 8 with higher mechanical accuracy. In addition, while the spherical lenses 8 are temporarily fixed to the package substrate 3 by the transparent resin 9, the final fixation is done by using the mold resin 7.

A typical manufacturing process is as follows. First, more than one photoelectric conversion element array 2 is mounted on the package substrate 3, and then thermal processing is performed in an inactive gaseous atmosphere at a temperature of 300° C. with the solder balls 10 as AuSn eutectic crystals.

Next, a silicone-based resin material (the transparent resin 9), for example, is injected into the through-holes 20 of the package substrate 3, while taking into consideration a stress applied to the photoelectric conversion element array 2. Subsequently, the spherical lenses 8 are attached to the package substrate 3.

After the transparent resin 9 is hardened through thermal treatment, a resin-molding is applied to the resultant overall structure. In addition, because the transparent resin 9 has been filled in advance into any spaces between the photoelectric conversion element array 2 and the spherical lenses 8, the mold resin 7 will hardly enter or "invade" optical paths, which avoids the necessity of having to determine optical characteristics of the mold resin 7. Further, the mold resin 7 may include certain resin materials high in optical absorption characteristics to prevent invasion of externally incoming light rays.

The mold resin 7 may alternatively be made of presently available standard LSI packaging resin materials including, but not limited to, an epoxy resin with an added glass filler for adjustment of thermal expansibilities. Obviously, the metal tool as used during the molding process has been set to prevent the mold resin from overflowing and cover distal ends of the optical lenses 8.

Figure 3:
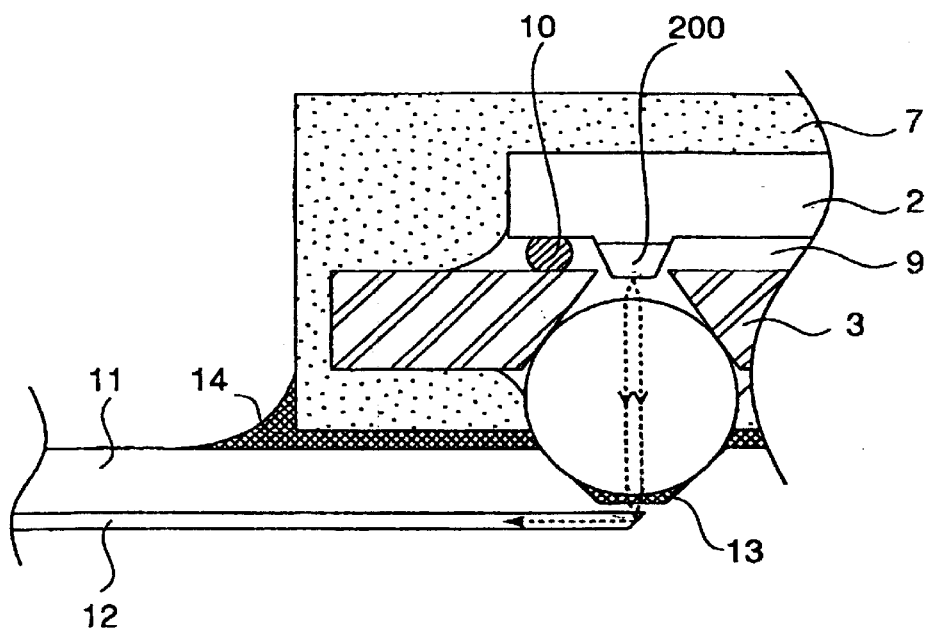
FIG. 3 is a cross-sectional view of a mounting state of the optical wiring device according to the present invention.

FIG. 3 is a cross-sectional view of the optical wiring device shown in FIG. 2 mounted on an optical wiring substrate. Referring to FIG. 3, reference numeral "11" designates the optical wiring substrate; 12 denotes an optical guide path or waveguide; 13 indicates an optical terminal receiving/fitting portion (concave portion) for optical coupling; 14 is a transparent resin material, which serves both as a temporal adhesive of the optical wiring package and as a protective member of an optical path.

The optical wiring substrate 11 may be formed from any one of the so-called glass-based optical waveguide substrates made of quartz or a multicomponent glass, etc., and the so-called resin-based optical waveguide substrates made of polymethyl-methacrylate (PMMA), polyimide fluoride, polycarbonate (PC) or other similar suitable materials. In the illustrative embodiment, the optical waveguide is of the type which permits propagation of light in the horizontal direction, in which a forty five degree (45°) processing of light path orthogonal conversion has been done at the optical waveguide edge portions (optical input/output sections and substrate concave portions). This is also attainable by use of coupling due to a diffraction grating or an internal mirror or the like. The arrangement, such as the orthogonal conversion or the like, is not required in the case in which light propagation is in a direction perpendicular to the substrate.

An exemplary mounting process of this embodiment is as follows. First, an optical input/output section 13 of the optical wiring substrate 11 is coated with either a transparent resin or a transparent resin adhesive 14 to mount and fix the optical wiring package. The transparent resin 14 includes, for example, a transparent resin material such as a silicone resin or epoxy resin. An adhesive may also be used together with the transparent resin for vacant spaces, because even though a standard-use transparent resin alone might attain the required functionality as a bulking agent or filler, positional misalignment may occur at later process steps. The use of an acrylic or epoxy-based transparent adhesive makes it possible to simultaneously perform mounting and fixation of the optical wiring package. Further, when an ultraviolet ray-hardenable resin or the like is used, the intended fixation or adhesion process may be done within a shortened time period. This process is equivalent to the steps of position alignment and temporal fixation using adhesive during the mounting process of standard LSI packages.

Next, other packages and electronic components are temporarily fixed. The optical wiring substrate 11 is then subject to a soldering reflow process. Thereafter, soldering the connection of electrical terminals is performed. This process is similar to that in a standard LSI mounting procedure.

Thus, the optical wiring device of the present invention is mounted in a substantially same fashion as for standard LSI mount architectures. Therefore, the currently available mounting methodology may be used with only a mere modification of resin materials used to fill optical input/output terminal sections. In addition, because the optical waveguide 12 is not exposed to the surface of the optical wiring substrate 11, a wiring substrate wash/cleaning process and the like may be handled in a way similar to that of standard LSI mount substrates. Further, even if any residual cleaning fluid is present, its influence is negligible because the focal point of light lies within the substrate. This is a similar effect to that obtained in cases where optical disks, such as compact discs (CDs) or the like, offer increased handleabilities as compared to traditional analog record carrier bodies, etc.

Figure 4:
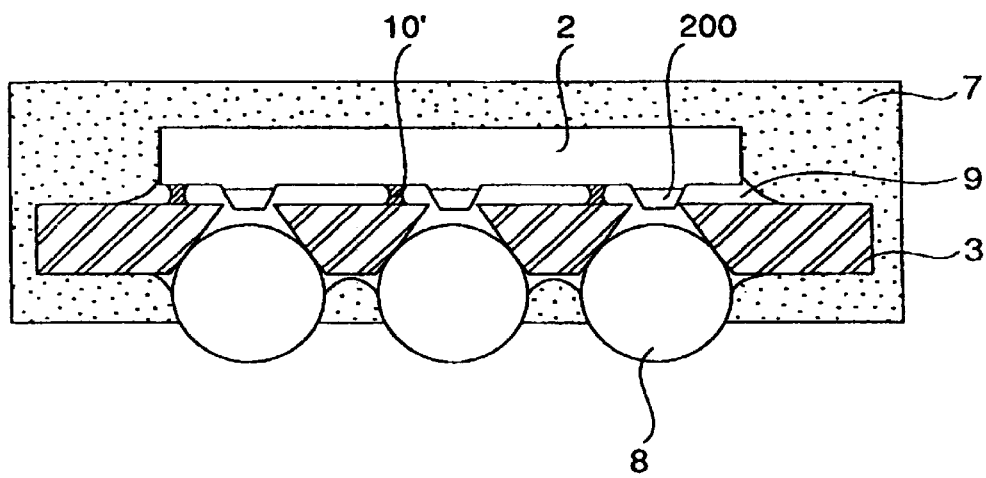
FIG. 4 is another cross-sectional view of an optical terminal section of the optical wiring package according to the present invention.

FIG. 4 shows another example of the optical wiring package structure of the present invention. In this embodiment, the components 10 (solder bumps) of FIGS. 2 and 3 are replaced with currently available standard connect solders 10' and the photoelectric conversion element active portion 200 is inserted into a corresponding through-hole of the package substrate 3. An outer portion of the conversion element 200 is mechanically attached and abutted to the through-hole for achieving the required position alignment.

An advantage of this example is the fabrication of passivation films for forming the solder bumps and formation of solder layers as thick as several tens of μm is avoided. Another advantage is the reduction of material and processing costs, while at the same time shortening the process time because of the unnecessity of any reflow process steps for the solder bumps.

Figure 5:
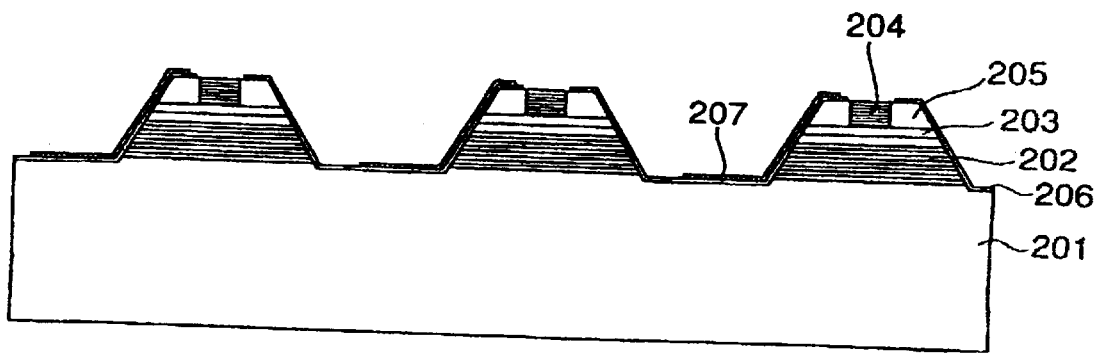
FIG. 5 is a cross-sectional view of an arrangement of photoelectric conversion elements for use in the optical wiring package according to the present invention.
Figure 6:
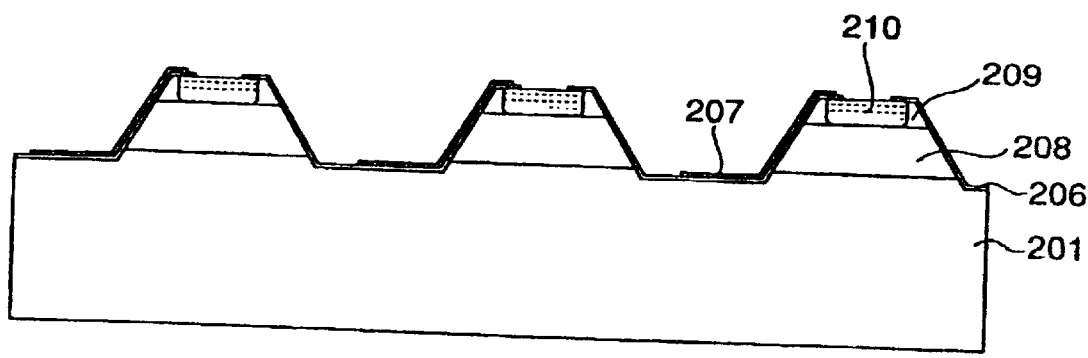
FIG. 6 is a cross-sectional view of another arrangement of photoelectric conversion elements for use in the optical wiring package according to the present invention.

FIGS. 5 and 6 illustrate exemplary optical semiconductor elements for use in the embodiment of FIGS. 2 and 3. In more detail, FIG. 5 illustrates light-emitting photoelectric conversion elements (array), whereas FIG. 6 depicts light-receiving photoelectric conversion elements (array). Further, FIG. 5 shows as an example a semiconductor laser of the vertical distributed Bragg reflector (DBR) type, and FIG. 6 shows a p-i-n or "pin" type photodiode (PIN-PD).

Numeral "201" of FIG. 5 designates a semiconductor substrate; 202 denotes a lower multilayered mirror; 203 indicates an active layer; 204 is an upper multilayered mirror; 205 is a mode control unit; 206 is a surface passivation film; and 207 is a wiring electrode (for the upper part). In a case the oscillation wavelength is a 0.78 $\mu$m band, for example, the semiconductor substrate 201 is made of GaAs, the multilayer mirrors 202, 204 are formed of $\lambda/4$ films of AlAs and AlGaAs, the active layer 203 is made of either GaAlAs or a GaAs thin film as the so-called quantum well, and the surface passivation film 206 is made of a dielectric film including, but not limited to, $SiO_2$ film or $SiN_x$ film.

The mode control unit 205 is fabricated through an embed-growth of GaAs, for example, to exclude high-order lateral modes and extraneous radiant light rays. An effect of this procedure lies in preventing any stray light of high angles from mixing into an output light of optical terminals. This procedure is aimed at suppressing light rays attempting to fall onto undesired portions other than the target optical input/output sections of the optical wiring substrate to prevent occurrence of interference such as crosstalk and the like.

Numeral 201 of FIG. 6 designates the semiconductor substrate; 208 denotes a light absorption layer; 209 is an upper window layer; and 210 is an impurity diffusion region. Assuming light of the 0.78 $\mu$m band is received, the substrate 201 is made of GaAs of a high carrier density, the layer 208 is formed of GaAs of a low carrier density, and the layer 209 is made of AlGaAs of high carrier density. In addition, the region 210 includes an impurity of the opposite conductivity type to the semiconductor substrate 201 as introduced thereinto by thermal diffusion or the like. When applying a pn reverse bias to this element, the low carrier density layer 208 is depleted causing a drifting of carriers to occur due to the light absorption. Thus, it is possible to attain high speeds at frequencies of several GHz or more. Si may also be used when the wavelength of light received is of the 0.78 $\mu$m band. If all components involved are made of Si in a similar carrier density, then similar functionalities are obtainable.

The light-emitting and light-receiving photoelectric conversion elements in FIGS. 5–6 include an active part formed into a mesa, while an electrode is elongated up to a lower part of the mesa using the wiring electrode 207. This structure is applicable to the optical wiring package shown in FIG. 4. This manner is shown as a perspective view in FIG. 7, in which numeral 211 denotes a ground electrode formed at a predetermined location offset from a wiring electrode 207 of an element active part 204.

Although the ground electrode has not been discussed in conjunction with the embodiments shown in FIGS. 1–6, a lead pattern forming the electrode may be railed integrally so it is continuously elongated from a lower surface of the substrate 201. Alternatively, the electrode may be simultaneously connected to the wiring electrode 207 on the package substrate 3. In this case, more than one package lead is extended out of the electrode 207 in a specified direction perpendicular to the array layout direction of the photoelectric conversion element. Thus, the ground electrode 211 is provided so it runs away from such space. This makes it possible to reduce stray or parasitic capacitances between the ground electrode and its associative signal electrodes.

Figure 7:
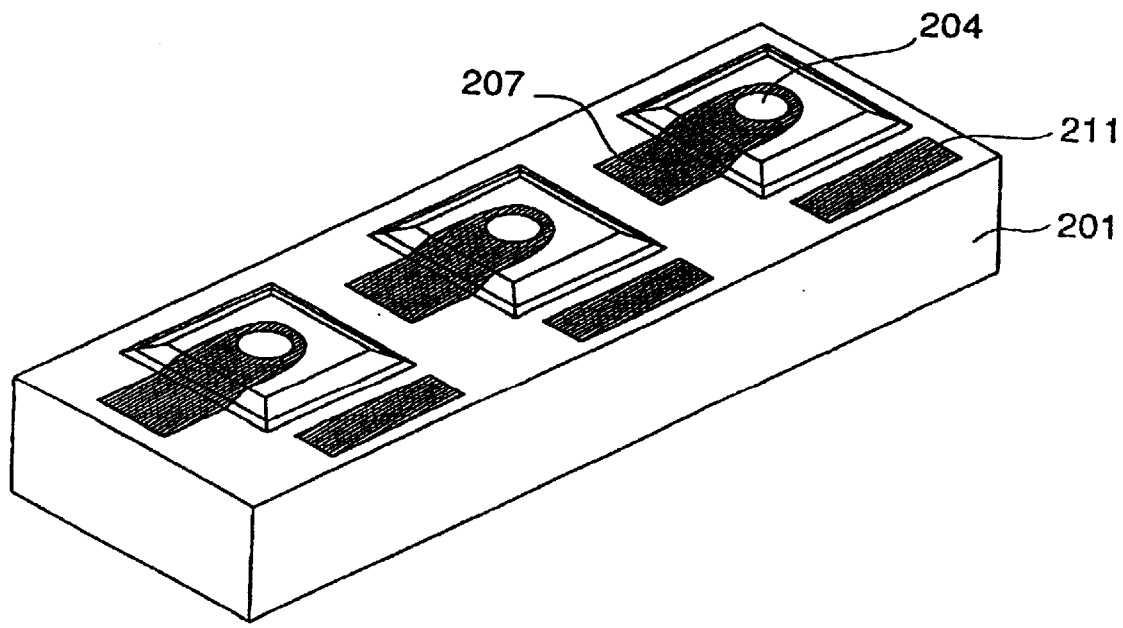
FIG. 7 is a perspective view of still another arrangement of photoelectric conversion elements for use in the optical wiring package according to the present invention.

In addition, in the embodiments of FIGS. 5–7, the light-emitting photoelectric conversion elements may be replaced with light-emitting diodes (LEDs) and the light-receiving photoelectric conversion elements may be replaced with metal semiconductor contact type elements. Additionally, the wavelength of emitted light, etc., is freely modifiable depending upon optical wiring device design schemes and/or materials used, etc., on a case-by-case basis.

Figure 8:
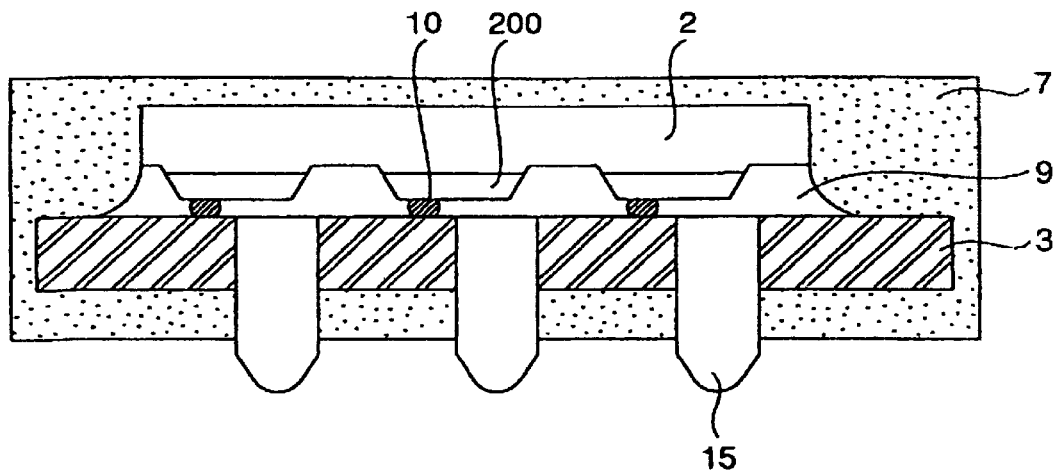
FIG. 8 is yet another cross-sectional view of an optical terminal section of the optical wiring package according to the present invention.

FIG. 8 shows another embodiment of the optical wiring package of the present invention, which is a modified example of the optical wiring terminals of the embodiments shown in FIGS. 2 and 4.

A principal feature of this embodiment is that optical terminals 15 are formed of transparent rods made of glass or resin materials. The optical terminals 15 can be preformed prior to the mounting of integrated circuit components and photoelectric conversion elements on the package substrate 3. Thus, with the embodiment of FIG. 8, after mounting integrated circuit components and photoelectric conversion elements and having filled the transparent resin 9, the packaging process immediately proceeds to a resin molding process. Accordingly, it is not necessary to perform the lens attachment process steps corresponding in number to the optical terminals. Thus, substantially the same processes as those in the manufacture of standard LSI packages may be used and the optical wiring packaging process is simplified.

Although the example of FIG. 8 illustrates tip-rounded taper-shaped optical terminal rods, the rods may have hemispherical distal ends. The use of round-tip taper-shaped and hemispherical shaped rods is appropriately determined based on optical coupling design and/or engagement design schemes between the terminals and the optical wiring substrate.

Figure 9:
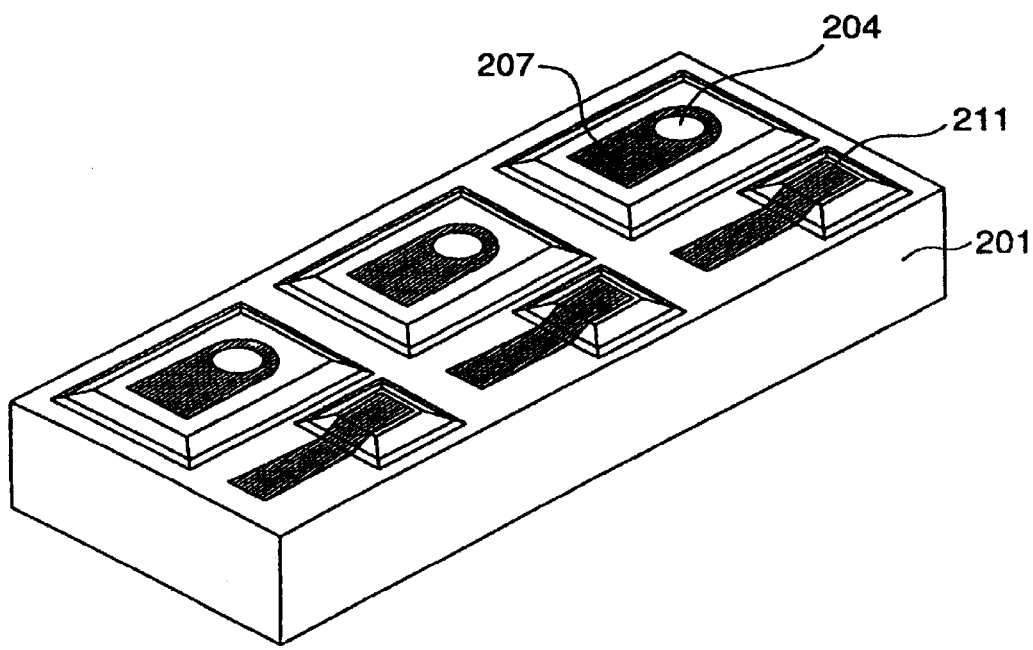
FIG. 9 is a perspective view of yet another arrangement of photoelectric conversion elements for use in the optical wiring package according to the present invention.

FIG. 9 is an example of an array of photoelectric conversion elements suitable for use in the embodiment of FIG. 8. FIG. 9 differs from the structure of FIG. 7, because the wiring electrodes 207 are on the active element surface, and a respective ground electrode 211 is formed on a top surface overlying a dummy mesa. Even though the space required for the dummy mesa results in a cross-over or intersection of an extended electrode of the wiring electrode 207 at a certain substrate surface portion of the ground electrode 211, the resultant stray capacitance may be made relatively smaller in value because of a spatial separation by a degree corresponding to the height of the mesa.

Further, the photoelectric conversion elements of FIG. 7 may also be used in the embodiment shown in FIG. 8. In addition, the photoelectric conversion elements of FIG. 9 may be used in the embodiments of FIGS. 2 and 4. This may be achieved through a slight modification in shape of the package substrate 3 and photoelectric conversion elements.

In addition, even though the photoelectric conversion element arrays in the above embodiments are mounted separately at a process step other than the step of mounting the semiconductor integrated circuitry and are connected by electrical leads, the semiconductor photoelectric conversion elements may alternatively be integrated together with the semiconductor integrated circuitry.

Figure 10A:
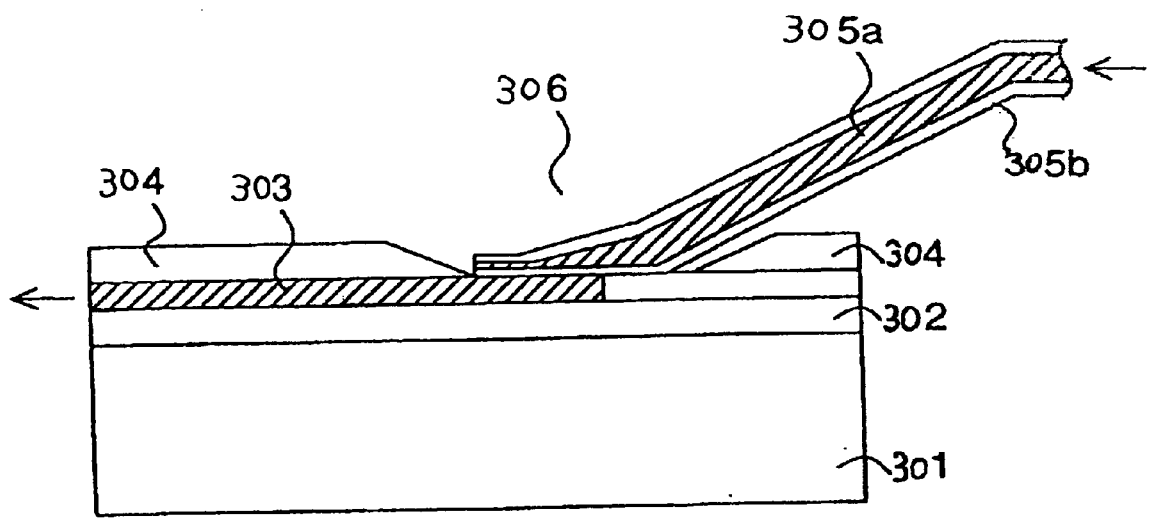
FIG. 10A is a cross-sectional view of another optical wiring device according to the present invention.
Figure 10B:
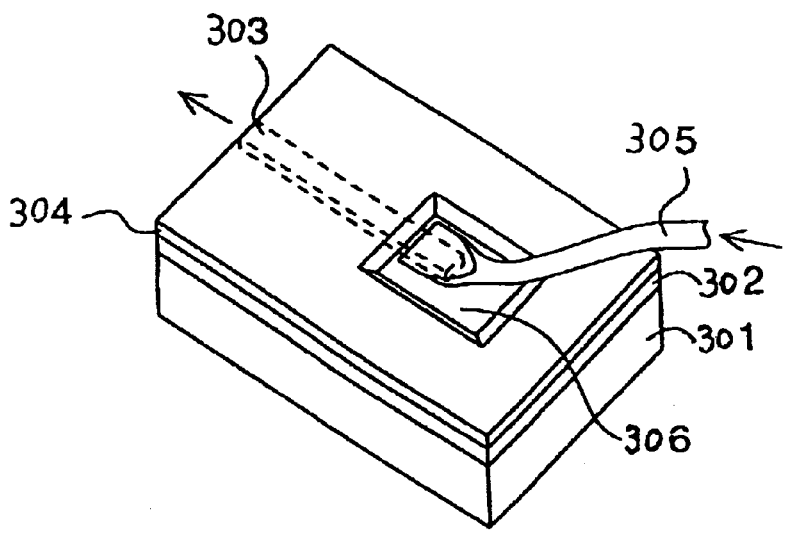
FIG. 10B is a perspective view of the device shown in FIG. 10A.

FIG. 10A is a cross-sectional view of another optical wiring device of the present invention, and FIG. 10B is a perspective view thereof.

Numeral 301 designates a substrate; 302 denotes a clad (light confinement section); 303 indicates an optical waveguide path; and 304 denotes a clad (light confinement section), all of which are for forming an optical wiring substrate. The optical waveguide 303 is buried or embedded by the clads 302, 304, thereby permitting rays of light to be transmitted within a "closed" space of the optical waveguide. In addition, 305a denotes a core (optical waveguide), and 305b is a clad (light confinement section), which forms an optical wire.

In addition, the upper clad 304 is removed at a specified part of a bonding pad (contact) 306 associated with the optical wire 305. Thus, sufficient optical coupling is obtained between the optical wire 305 and the optical waveguide 303, which results in the prevention of losses occurring due to optical scattering and/or absorption. Light rays propagating inside the optical wire 305 are typically such that some rays reflect at a cutaway portion of the optical wire 305 while the remaining rays pass through it in accordance with the refractivity difference between an effective refractivity of propagation light within the optical wire 305 and a refractivity within a medium on the output side. However, in this case, because the optical waveguide core 303 is optically coupled directly to the cutaway portion of the optical wire 305, part of the propagating light is guided into the optical waveguide 303 side whereby light distribution gradually shifts toward the optical waveguide 303 side while the light is progressing along the optical pad section 306.

Typically in the optical wiring substrate, the clad layers sandwiching the optical waveguide are fabricated at a sufficient thickness to suppress the optical waveguide's radiation losses or the like. Thus, optical coupling from the optical wire to the optical waveguide hardly occurs. However, with the present invention, as the upper clad 304 is removed at the optical pad section 306 causing the optical waveguide core layer 303 to be exposed, signal light reaching and entering the optical wire 305 as shown by an arrow in FIGS. 10A and 10B is coupled to the optical waveguide 303 at the optical pad section 306 and then progresses along the optical waveguide 303. Obviously, this is a passive optical coupling; hence, its inverse process is also possible. That is, light incoming from the opposite direction to the arrow is permitted to be transmitted without any losses.

In addition, because the optical wire 305 is specifically designed to have a tapered configuration with its thickness gradually decreasing at the optical pad section 306, it is easier to provide the intended optical coupling between the optical wire 305 and optical waveguide 303. In a case the optical wire 305 has a constant thickness, the resultant optical resonance conditions can vary with a change in length of an overlap part between the optical wire and the optical waveguide, which results in the optical coupling characteristics changing accordingly. Thus, optical waveguide conditions become unsatisfied towards the distal end of a taper section, thereby causing waveguide light to gradually flow out or "effuse" toward an outside of the optical wire 305. As a result, in cases where the optical wire 305 is in the ambient air, namely, in case this wire is not in close proximity to the optical waveguide 303, reflection of waveguide light will occur in a way similar to the case of cutting the optical wire 305. Where the optical wire 305 is directly adjacent to the optical waveguide 303 as in this embodiment, a certain type of mode conversion will be established, which permits light rays effused from the optical wire 305 to smoothly shift toward the optical waveguide 303 side.

As a result, arranging the optical wire 305 to have the taper-like shape at the contact portion 306 makes it possible to enhance the resultant optical coupling efficiency between the optical wire 305 and optical waveguide 303.

An explanation will now be given for a method and apparatus for manufacturing the optical wiring device of the present invention with reference to FIGS. 11 and 12 below.

Figure 12:
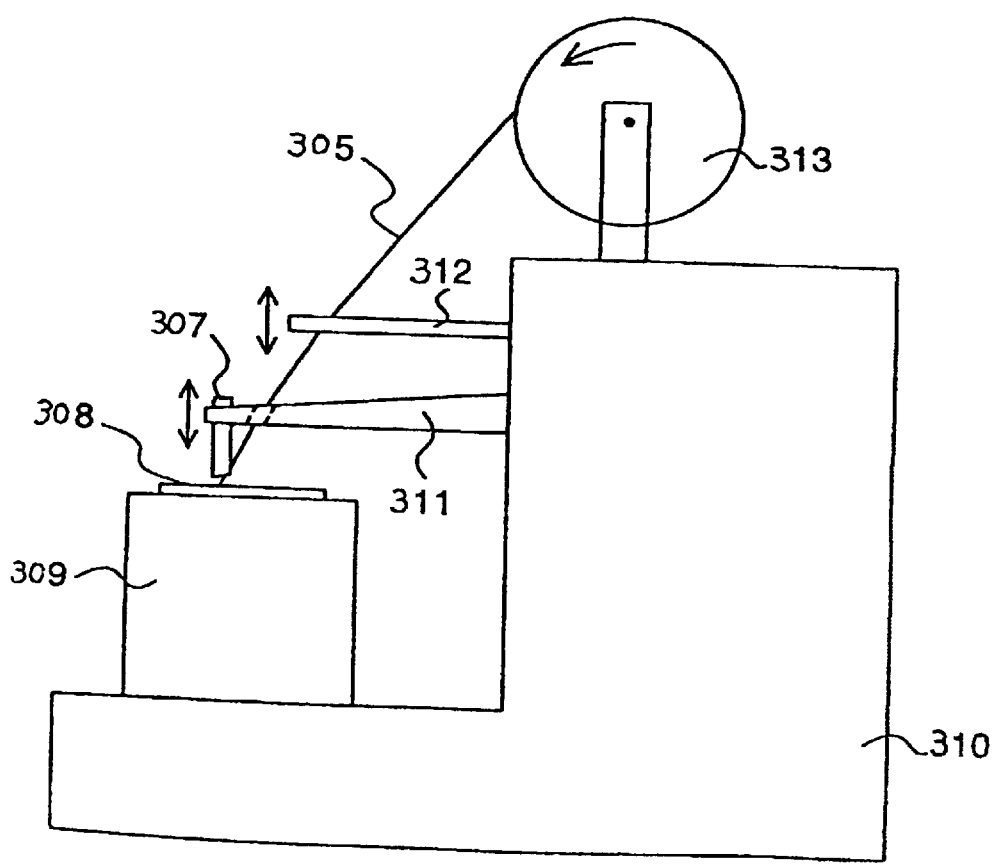
FIG. 12 is a cross-sectional view of an apparatus for manufacturing the optical wiring device of the present invention.

In FIG. 12, reference numeral 307 designates a bonding collet; 308 denotes an optical wiring substrate; 309 is a bonding stage; 310 is an apparatus main body; 311 is a bonding arm; 312 is an optical wire feed control arm; and 313 is an optical wire reel (optical wire containment unit).

The bonding stage 309 includes a heating mechanism, and the bonding arm 311 is operatively associated with attachment devices, including an ultrasonic wave oscillator and pressure control mechanism. In addition, the feed control arm 312 is operable to perform fixation and release of the optical wire 305 corresponding to the bonding sequence and to add a tensile force of the optical wire 305.

Figure 11:
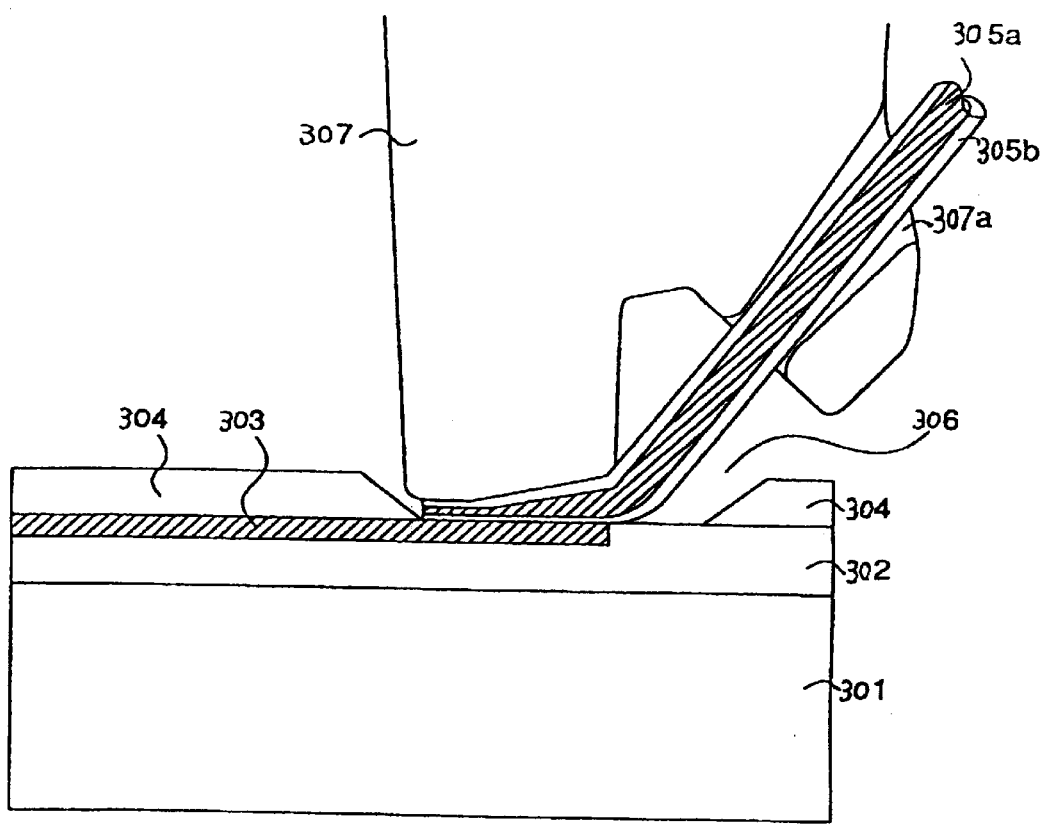
FIG. 11 is a cross-sectional view of a main part of an apparatus for manufacturing the optical wiring device of the present invention.

In FIG. 11, numeral 307 denotes the bonding collet, and 307a indicates a guide hole of the optical wire 305, in which the collet 307 is designed to enable application of a pressure and ultrasonic waves used for rigid attachment and fastening of the optical wire 305. 305a again denotes a core (optical waveguide) and 305b is a clad (light confinement section).

Examples of respective components are as follows. The substrate 301 may be formed of a ceramic substrate made of alumina, quartz, aluminum nitride, etc., a semiconductor substrate made of Si, etc., a resin substrate of polyimide or epoxy, or other similar suitable materials.

The clad layer 302 and core layer 303 include, for example, a high-purity quartz with a chosen impurity doped thereinto for changing the refractivity, glass materials such as a multicomponent glass or the like, or resin materials with a refractivity changed through either adjustment of polymerization conditions or additive doping processes of certain resin materials including, but not limited to, acrylic resin, polyimide resin, epoxy resin, or fluoride resin of these materials.

The core layer 303 is designed to be greater in refractivity than the clad layer 302, which may be set in a variety of forms in view of several conditions including the wavelength of a light source used, waveguide mode (i.e., whether a single mode or multiple mode), limitations to optical waveguide losses and others.

While the clad layer 304 may be the same material as the clad layer 302, the clad layer 302 and core layer 303 may include different materials so the clad layer 304 includes a chosen material that can be selectively removed through etching, etc., to process the optical pad 306. The optical pad 306 may be manufactured by a variety of fabrication methods including etching in alignment with the position of the optical waveguide core 303 or by employing a select mask for coverage during formation of the clad layer 304 to prevent fabrication of any clad layer. Additionally, a brute-force bonding material may be preformed in a region of the optical pad 306, which material is for rigidly fixing the optical wire 305 corresponding to the materials forming the optical wire 305 and optical waveguide 303.

The optical wire 305 may be an optical waveguide structure including chosen resin materials including, but not limited to, acrylic resin, polyimide resin, epoxy resin or fluoride of these resin materials to ensure the structure is high in deformability and adhesiveness upon application of ultrasonic waves and heat (i.e., optical fiber with a coaxial core), or a ribbon-shaped optical waveguide with a flat core laminated with a clad material.

The collet 307 may include the same materials as those used in the metal-wire bonding of electrical wiring devices, including, for example, tungsten, titanium, molybdenum, or chemical compounds with these elements as the base element thereof (e.g., tungsten carbide, titanium carbide, and others)

A procedure for connecting the optical wire 305 includes setting the optical wire 305 at a predetermined location of the collet 307, for example, so the wire is aligned with a distal end of the collet 307. Then the collet 307 is moved toward an optical pad section, the optical wire 305 is pushed against the optical pad 306 with respect to each collet 307, and ultrasonic waves are applied to a part overlying the collet 307 at a moment a pushing pressure of the collet 307 reaches a predefined value. In a case the optical wire 305 is, for example, an acrylic resin-made optical fiber of 30 $\mu$m diameter with a contact length between the distal end of the collet 307 and the optical wire 305 set at 50 $\mu$m, the pushing pressure of the collet 307 is set at 20 grams (g) while ultrasonic waves applied to the collet 307 are 50 kHz in frequency upon application of an electric power of 5 watts (W) for five seconds.

During application of the ultrasonic waves, the optical wire 305 is softened (or partly melted) by heat at an interface of the optical pad 306 due to the applied ultrasonic waves resulting in a shape corresponding to a shape of the distal end of the collet 307 along with the rigid attachment to the optical pad 306. In particular, in the case the optical wire 305 is made of a thermally deformable resin material, this process is readily achievable due to the materials increased meltability. In addition, as shown in FIG. 1, after the ultrasonic wave application is finished, solidification again takes place to complete the required mechanical connection.

Subsequently, the collet 307 is moved while retaining free extendability of the optical wire 305 for preventing unwanted detachment or peel-off of the rigidly attached optical wire 305, thus completing a connection between the optical wire 305 and the optical waveguide 303.

Figure 13:
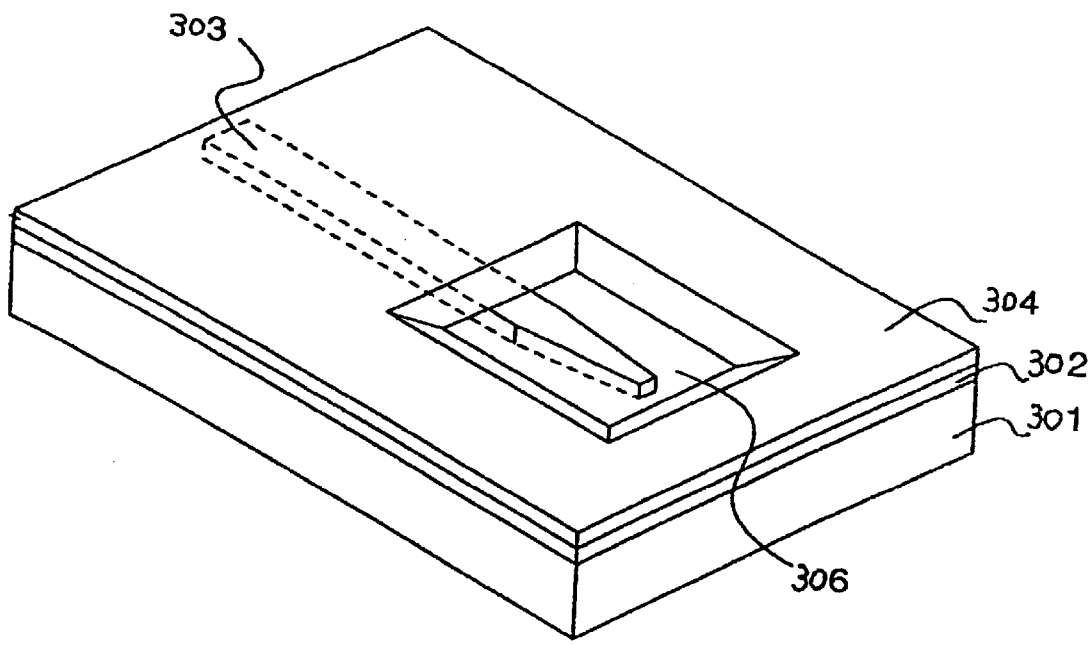
FIG. 13 is a perspective view of another embodiment of an optical wiring device of the present invention.

FIG. 13 shows another embodiment of the optical wiring device of the present invention. In this embodiment, the connect part between the optical waveguide 303 and optical wire 305 includes a taper-like shape with the width becoming narrower toward decrease in distance to its distal end. In addition, the optical waveguide 303 is formed so its distal end is gradually narrowed, thereby offering similar effects and advantages to those obtained in the structure shown in FIG. 10A and FIG. 10B (i.e., with the optical wire 305 tapered at the connection between the optical waveguide 303 and optical wire 305). Simultaneous implementation of this arrangement along with the scheme for tapering the optical wire 305 side as stated in conjunction with the embodiment of FIGS. 10A–10B makes it possible to further enhance the optical coupling efficiency while at the same time advantageously increasing the tolerance of optical coupling with respect to any possible positional deviation of the optical wire 305.

Figure 14A:
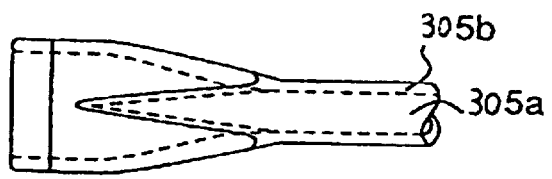
FIG. 14A is a top plan view of a tapered connect part of an optical wire.
Figure 14B:
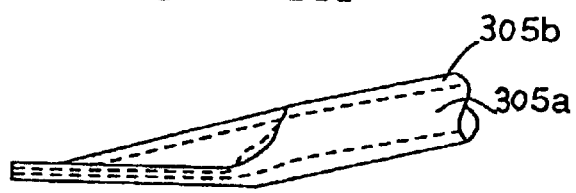
FIG. 14B is a side view of the part shown in FIG. 14A.

FIG. 14A is a top plane view of a tapered connect part of the optical wire 305, whereas FIG. 14B shows a side view thereof. 305a again denotes a core (optical waveguide) and 305b is a clad (light confinement section).

The shape shown in FIGS. 14A–14B is obtainable by deforming the optical wire 305 while providing a tapered concave portion in the collet 307. The optical wire 305 has its center part formed so a distal end is thinned both at lateral sides and at upper surface thereof while an inverse taper section has been compressively crushed to become uniformly thinned. Thus, it is possible to enhance the resulting optical coupling between the optical wire 305 and optical waveguide 303 while preventing a decrease in contact area of the connection surface of the optical wire 305. Accordingly, an advantage is the connection strength of the optical wire 305 to optical waveguide 303 is substantially the same as that of FIGS. 10A–B. Another advantage is the fabrication of this shape is implementable through a mere modification in a shape of the distal end of collet 307.

Figure 15:
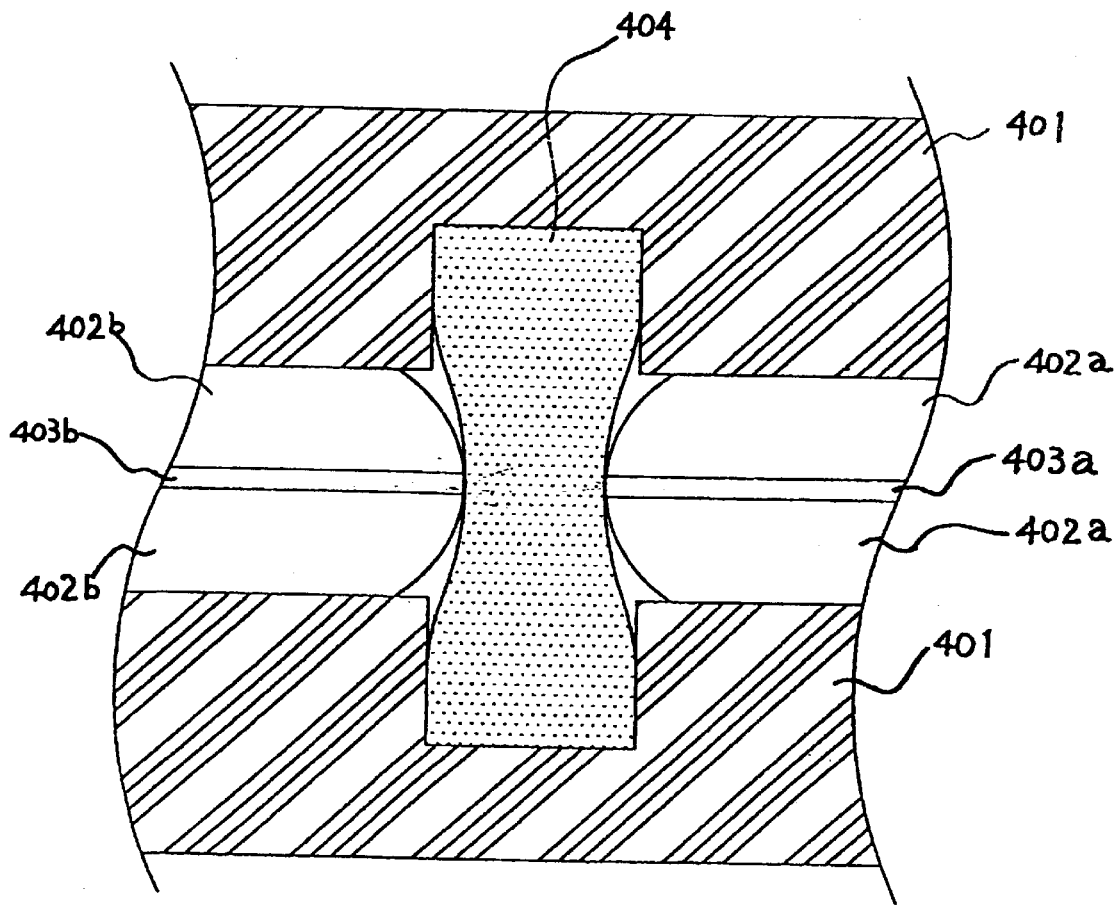
FIG. 15 is a cross-sectional view of an optical coupler device according to the present invention.

FIG. 15 is a cross-sectional view of an optical coupler device according to the present invention.

As shown in FIG. 15, a pressure sensitive optical filter 404 (which permits transmission of light rays upon application of a pressure) is engageably fitted into the interior of a sleeve 401 with ferrule members 402a, 402b stably inserted into the sleeve 401 from the right and left sides thereof. The term "ferrule" as used herein refers to a cylindrical member for use in supporting an optical fiber while performing protection and position alignment upon attachment and detachment of an optical connector. The ferrule is covered at a terminate end of the optical fiber with its distal end being polished together with the optical fiber for permitting exposure of the optical fiber end. With optical connectors of the multi-core optical fiber type (i.e., ribbon-like array type), another type is also available in which its outer shape resembles a rectangle with optical fiber insertion holes being aligned along the center line thereof, which is also referred to as a ferrule among those skilled in the art to which the invention pertains.

The ferrules 402a, 402b include elongated optical waveguide bodies 403a, 403b, respectively, each of which is formed centrally in a corresponding ferrule 402a, 402b. Each optical waveguide body may be structured from an optical fiber having a core within a clad layer. Here, the components are not-to-scale for purposes of a well understanding of the illustrative configuration. A detailed configuration of the pressure-sensitive optical filter 404, and a practical example thereof is described later.

The optical waveguide bodies 403a, 403b are core-center fixed in the ferrules 402a, 402b, respectively, with distal ends rounded and smoothened through a polishing/abrasion treatment. The ferrules 402a, 402b are constantly pushed by springs (not shown) against the pressure sensitive optical filter 404 from the right and left directions (e.g., a pressure of 1 kg). In this case, as pressure is applied to the optical filter 404, the optical filter 404 is made transparent causing the optical waveguide 403b, pressure sensitive optical filter 404 and optical waveguide 403a to be optically coupled together. In addition, when any one of the optical waveguide bodies is removed or unloaded, no pressure is applied to the pressure sensitive optical filter 404. Accordingly, this filter is set in either an absorption state or reflection scattering state to ensure light is virtually completely blocked while letting no rays leak from the pressure sensitive optical filter 404. This prevents leakage of light rays from the optical coupler device when one of the optical waveguide bodies has been detached or removed.

In addition, although the pressure sensitive optical filter 404 is rigidly fixed within the optical coupler device in this embodiment, light rays may leak upon detachment or unloading of a light output side ferrule. While such optical leakage poses no serious problems in cases where the structure is employed as an interexchange/repeater-use optical connection device operatively associated with optical mounting devices, certain problems can occur where the optical coupler device is not fixed to a rack of a system. If this is the case, the device may be modified so the pressure sensitive optical filter 404 is stably fastened to the distal end of the light output side ferrule. In such a case, it is possible to successfully prevent destruction of the pressure sensitive optical filter 404 by specifically designing an external housing of ferrules 402 to surround the distal end, thereby preventing any possible destruction of the pressure sensitive optical filter 404.

Additionally, it is preferable the surface polishing of the distal ends of ferrules 402 and optical waveguide bodies 403a, 403b form spherical shapes as shown in FIG. 15, which makes it possible to attain concentration of pressures at a part of the optical waveguide bodies, thus making an operation of the pressure sensitive optical filter 404 more effective.

Figure 16:
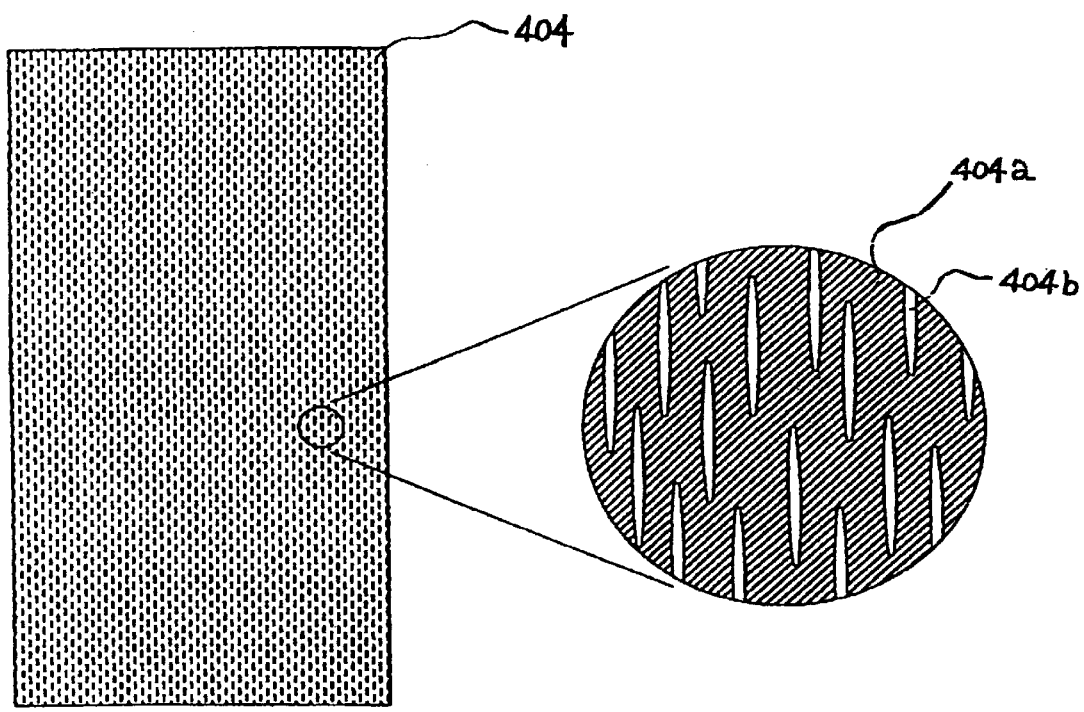
FIG. 16 is a cross-sectional view of a pressure sensitive optical filter for use with the optical coupler device of the present invention.

FIG. 16 is a cross-sectional view of the pressure sensitive optical filter 404 for use with the optical coupler device of the present invention.

As shown in FIG. 16, the pressure sensitive optical filter 404 includes a base material 404a with a number of ultrafine or "micro" openings or holes 404b dispersed therein. The base material 404a may be a material that is deformable upon application of a compressive pressure and optically transparent at a preset or "in-use" frequency, including certain resin materials such as silicone resin, "soft" acrylic resin, polycarbonate, or ultrathin glass films, or any other similar suitable materials. It is also preferable the refractive index thereof is substantially equal to refractive indexes of the optical waveguide bodies used, to achieve light propagation matchability or consistency with the optical waveguide bodies.

The microholes 404b are each formed in an elongated shape in a specified direction perpendicular to the pressure application direction (right/left direction in FIG. 16). With such an arrangement, the holes are easily crushable when pressed and thus become transparent to light rays when a shorter inner diameter of the holes is sufficiently shortened to be less than the wavelength of waveguide light.

A method of manufacturing the pressure sensitive optical filter 404 will now be explained.

The filter 404 includes a chosen resin material such as silicone resin, for example. In this case, a precursor (liquid) of the silicone resin is stirred by a mixer causing air bubbles to be mixed thereinto. Then, the resultant liquid is half-solidified and rolled under pressure to provide a rolled sheet-like member. The sheet-like member is then thermally hardened while applying a pressure thereto, thus completing the intended filter. The compressive rolling and pressure application processes are for forcing bubbles to deform into a flattened form, thereby making easier the adjustment of intervals of holes 404b and shrinkage due to the pressure application.

The holes 404b are such that reflection occurs at an interface thereof corresponding to a refractivity difference when a shorter inner diameter of the holes 404b is greater than a specified frequency equivalent to the frequency ($\lambda$) used or more or less. On the other hand, when the holes 404b shrink and the shorter inner diameter thereof is equal in degree to approximately $\lambda 10$, the resultant reflection at the interface becomes significantly smaller. The compression of the base material 404a due to the external pressure accompanies the compression of the holes 404b. In the presence of an external pressure, transmission of light rays is established with similar functionalities to those of refractivity matching materials. On the contrary, in the absence of any external pressure, such optical transmission will no longer be found because the holes function as optical scattering members. Thus, the structure includes the required functionalities of the pressure sensitive optical filter.

Because this example is designed so the holes 404b are embedded in the base material 404a, shrinkage of the holes 404b due to external pressure application leads to an increase in internal pressure. This causes the holes to recover into their original form due to the repulsion thereof when such external pressure is released. Thus, it is possible to increase the repeatable number of operations as the pressure sensitive optical filter.

Figure 17:
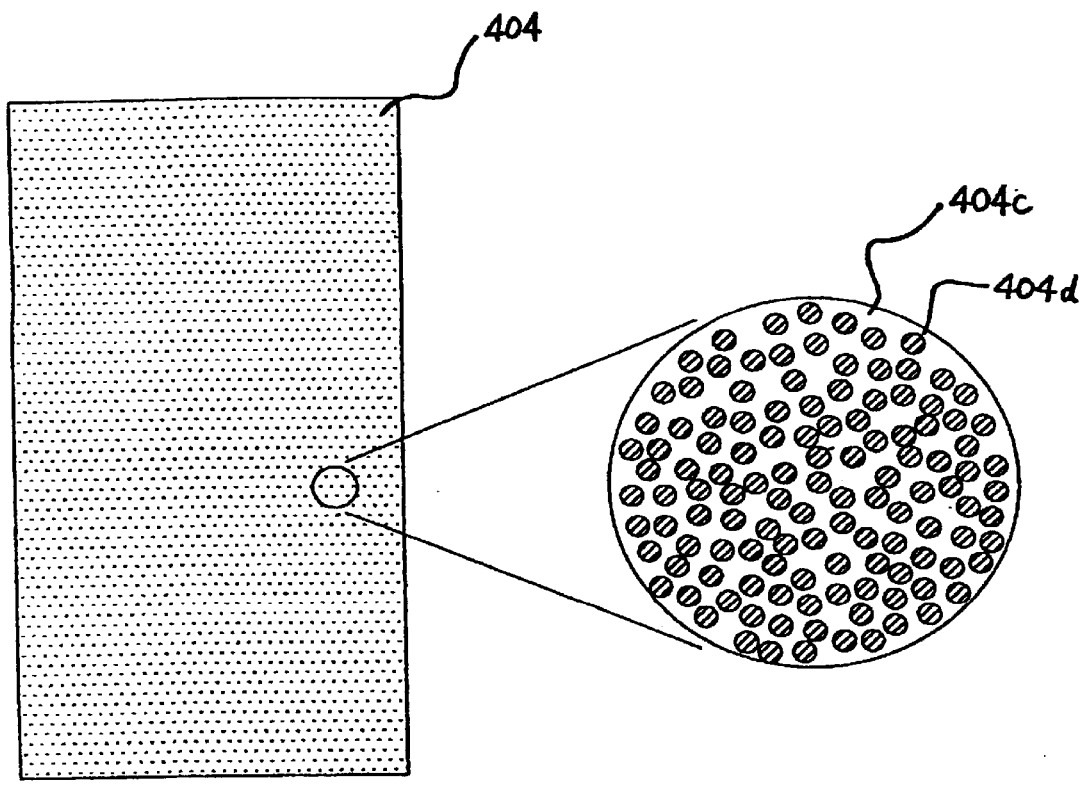
FIG. 17 is a cross-sectional view of another pressure sensitive optical filter for use with the optical coupler device of the present invention.

FIG. 17 is a sectional view of another pressure sensitive optical filter adaptable for use with the optical coupler device of the present invention.

As shown in FIG. 17, the pressure sensitive optical filter 404 includes a base material 404c with a number of ultrafine optical waveguide members 404d dispersed in the base material 404c. The waveguide "micro-particles" 404d are higher in refractivity than the base material 404c. The base material 404c may be any material that is deformable upon an application of a compressive pressure and is optically transparent at a preset use frequency, including but not limited to, resin materials such as silicone resin, soft acrylic resin, or polycarbonate. The optical waveguide microparticles 404d may include certain materials which are in refractivity equal to or slightly greater than the optical waveguide bodies 403 of FIG. 15, preferably, ultrafine spherical microparticles or "balls" made of quartz or high-refractivity polymer, for example.

A difference between the pressure sensitive optical filter shown herein and the filter shown in FIG. 16 is the base material 404c includes low-refractivity materials rather than the materials for use as refractivity matching materials to thereby permit reflection due to a refractivity difference between the base material 404c and the optical waveguide bodies 403 in the absence of optical waveguide microballs 404d. With the pressure sensitive optical filter 404 of FIG. 17, the portions in which the optical waveguide microballs 404d are present stay higher in equivalent refractivity. Therefore, when certain regions are compressed by an external pressure to increase the distribution density of the microballs 404d, the regions become greater in equivalent refractivity than the remaining regions, thus achieving the required optical waveguide functionalities. Alternatively, in the absence of any external pressure, light rays tend to scatter or disperse because of almost uniform distribution of the a optical waveguide microballs. Thus, light rays passing through the pressure sensitive filter are scattered, which results in a decrease in density of light intensities. Consequently, the pressure sensitive filter having enough thickness for such a decrease in density of light intensities makes it possible for the FIG. 17 structure to offer similar effects and advantages to those of the pressure sensitive optical filter 404 shown in FIG. 16.

The pressure sensitive optical filters of FIGS. 16 and 17 may be arranged so the optical absorption members are provided at selected portions other than those with optical waveguide functionalities for absorption of any scattering and dispersion light rays. This structure is capable of more effectively preventing undesirable light leakage and/or mixture of stray light rays during inactive or deactivation modes.

As apparent from the foregoing description, in accordance with the present invention, it is possible to accomplish the intended optical wiring and interconnection by use of currently available standard electronic device/element mounting schemes while at the same time advantageously offering the capability of establishing at low costs a required system capable of operating at high speeds at the board or rack level, without having to increase mounting costs.

Obviously, numerous modifications and variations of the present invention are possible in light of the above teachings. It is therefore to be understood that within the scope of the appended claims, the invention may be practiced otherwise than as specifically described herein.

What is claimed is:

1. An optical wiring device, comprising:
   a first substrate having a first surface and a second surface on an opposite side of the first surface, and having a hole through the first substrate between the first and second surfaces;
   an integrated circuit disposed on the first surface of the first substrate;
   a photoelectric conversion element provided on the first surface of the first substrate and configured to convert between electrical signals and optical signals;
   an optical terminal disposed in contact with the hole on a side of the second surface of the first substrate; and
   a second substrate having an optical wiring, and being attached to the first substrate with the optical terminal therebetween, said optical wiring running within said second substrate,
   wherein the second substrate has a concave portion, and the optical terminal has a curved plane in contact with the concave portion of the second substrate so as to be optically coupled to the optical wiring, and
   wherein the electrical signals are transmitted between the photoelectric conversion element and the integrated circuit, and the optical signals are transmitted between the photoelectric conversion element and the optical wiring through the optical terminal.

2. An optical wiring device according to claim 1, wherein the optical terminal has a curved plane opposing the optical wiring, and an optical focusing point due to the optical terminal is positioned at a portion of the optical wiring.

3. An optical wiring device according to claim 1, wherein the concave portion comprises a tapered form, and the curved plane of the optical terminal is a part of a spherical surface contacting a side surface of the concave portion.

4. An optical wiring device according to claim 1, wherein an optical focusing point due to the optical terminal is positioned at a portion of the optical wiring deeper than a bottom surface of the concave portion.

5. An optical wiring device according to claim 1, further comprising an electrical wiring provided on the side of the first surface of the first substrate, and being connected to the integrated circuit.

6. An optical wiring device according to claim 1, wherein the optical terminal has a spherical shape.

7. An optical wiring device according to claim 1, wherein the optical terminal has a curved plane opposing the photoelectric conversion element.

8. An optical wiring device according to claim 7, wherein the hole comprises a tapered form, and the curved plane of the optical terminal contacts a side surface of the first substrate surrounding the hole.

9. An optical wiring device according to claim 8, wherein the concave portion comprises a tapered form, and the optical terminal has a spherical shape.

10. An optical wiring device according to claim 1, further comprising an optical connector configured to optically connect the optical wiring to another optical wiring, the optical connector allowing optical signals to be transmitted therein upon application of a pressure thereto.

11. An optical wiring device according to claim 10, wherein the optical connector comprises a matrix portion and holes dispersed in the matrix portion, and
   wherein a longest diameter of each of said holes extends in a direction perpendicular to a direction in which said optical signals are transmitted.

12. An optical wiring device according to claim 10, wherein the optical connector comprises a matrix portion and particles dispersed in the matrix portion, and
   wherein a refractive index of the particles is higher than a refractive index of the matrix portion.

13. An optical wiring device comprising:
   a first substrate having a first surface and a second surface, said second surface provided on the opposite side of said first surface of said substrate, a hole provided through said first substrate between said first surface and said second surface;
   a second substrate having an integrated circuit and a photoelectric conversion element configured to convert between electrical signals and optical signals, and being attached to said first substrate, each of said integrated circuit and said photoelectric conversion element being disposed facing said first surface of said first substrate;
   an optical terminal being disposed in contact with said hole on the side of said second surface of said first substrate; and
   a third substrate having an optical wiring and being attached to said first substrate with said optical terminal therebetween, said optical wiring running within said third substrate,
   wherein said third substrate has a concave portion, and said optical terminal has a curved plane in contact with said concave portion of said third substrate so as to be optically coupled to said optical wiring, and
   wherein said electrical signals are transmitted between said photoelectric conversion element and said integrated circuit, and said optical signals are transmitted between said photoelectric conversion element and said optical wiring through said optical terminal.

14. An optical wiring device according to claim 13, wherein said curved plane of said optical terminal opposes said optical wiring, and an optical focusing point due to said optical terminal is positioned at a portion of said optical wiring.

15. An optical wiring device according to claim 13, wherein said concave portion is provided in a tapered form, and said curved plane of said optical terminal is a part of a spherical surface to be in contact with a side surface of said concave portion.

16. An optical wiring device according to claim 13, wherein an optical focusing point due to said optical terminal is positioned at a portion of said optical wiring deeper than a bottom surface of said concave portion.

17. An optical wiring device according to claim 13, further comprising an electrical wiring provided on said second substrate, said electrical wiring being connected to said integrated circuit.

18. An optical wiring device according to claim 13, wherein said optical terminal has a spherical shape.

19. An optical wiring device according to claim 13, wherein said optical terminal has a curved plane opposing said photoelectric conversion element.

20. An optical wiring device according to claim 19, wherein said hole is provided in a tapered form, and said curved plane of said optical terminal is in contact with a side surface of said first substrate surrounding said hole.

21. An optical wiring device according to claim 20, wherein said concave portion is provided in a tapered form, and said optical terminal has a spherical shape.

22. An optical wiring device according to claim 13, further comprising an optical connector configured to optically connect said optical wiring to another optical wiring, said optical connector allowing optical signals to be transmitted therein upon application of a pressure thereto.

23. An optical wiring device according to claim 22, wherein said optical connector comprises a matrix portion and holes dispersed in said matrix portion, a longest diameter of each of said holes extending in a direction perpendicular to a direction in which said optical signals are transmitted.

24. An optical wiring device according to claim 22, wherein said optical connector comprises a matrix portion and particles dispersed in said matrix portion, a refractive index of said particles being higher than a refractive index of said matrix portion.

25. An optical wiring device according to claim 1, wherein said optical terminal has a rod shape.

26. An optical wiring device according to claim 13, wherein said optical terminal has a rod shape.

* * * * *